United States Patent [19]

Black

[11] Patent Number: 5,488,290

[45] Date of Patent: Jan. 30, 1996

[54] ENERGIZING DEVICES FOR KILOWATT HOUR METER DISPLAYS

[75] Inventor: Billie E. Black, 256 Sasser Dr., Eight Mile, Ala. 36613

[73] Assignee: Billie Eugene Black, Eight Mile, Ala.

[21] Appl. No.: 115,596

[22] Filed: Sep. 3, 1993

[51] Int. Cl.$^6$ .................................................. G01R 35/04
[52] U.S. Cl. ............................................................ 324/74
[58] Field of Search .............................. 324/74, 157, 156, 324/405, 407, 412, 142, 141; 361/668, 661, 664; 364/571; 340/637, 654

[56] References Cited

U.S. PATENT DOCUMENTS

| | | | |
|---|---|---|---|
| 796,821 | 8/1905 | Dangler | 324/74 |
| 1,237,379 | 8/1917 | Platt | 324/74 |
| 2,030,522 | 2/1936 | Johansson | 324/74 |
| 2,249,075 | 7/1941 | Young et al. | 324/74 |
| 2,881,385 | 4/1959 | Smith | 324/407 |
| 3,530,340 | 9/1970 | Meacham | 361/364 |
| 4,117,530 | 9/1978 | Reed et al. | 361/365 |
| 4,271,390 | 6/1981 | Canu | 324/74 |
| 4,646,003 | 2/1987 | Phillips et al. | 324/74 |
| 4,922,185 | 5/1990 | Davidson et al. | 324/74 |

OTHER PUBLICATIONS

Farrington, Electrical World, Jan. 21, 1957, "Test Universal Polyphase Meters".

Primary Examiner—Vinh P. Nguyen
Attorney, Agent, or Firm—Nikaido Marmelstein Murray & Oram

[57] ABSTRACT

A device for energizing the electronic digital display found on current kilowatt hour meters in order to read the digital display of meters that have been removed from their site location that is simple to operate. The device would allow service personnel even those inexperienced with kilowatt hour meters to read the meter even if they are located in remote areas. In particular, the structure of the device will enable service personnel or the local utility office to read the meter without having to locate an energized meter socket with the correct terminal arrangement and correct voltage, or to taking the meter to an off-site meter test shop. The device generally incorporates a 13 terminal kilowatt hour meter socket and a six terminal kilowatt hour meter socket which are connected to a 120 volt power source through a step-up transformer.

15 Claims, 3 Drawing Sheets

ENERGIZING DEVICES FOR KILOWATT HOUR METER DISPLAYS

BACKGROUND OF THE INVENTION

A frequent need has developed in most local electric utility offices to obtain a meter reading from kilowatt hour meters having electronic digital register displays. In such circumstances when kilowatt meters are removed from their site location either for servicing or due to a termination of services, removal of the kilowatt hour meter deactivates its digital register display. Errors have arisen when service personnel either forgot or were unable to read the digital display prior to the meter's removal from the site location. Until recently, such kilowatt hour meters that have been removed were typically sent to a meter shop off-site. Generally, kilowatt hour meters sent to a meter shop were energized using specialized kilowatt hour meter testing devices designed to test the accuracy of the meters. However, such devices are very expensive and require special training in their use and operation. As a result, these testing devices have not been readily available to all service personnel nor are all service personnel necessarily trained in their use. This reliance on having to send meters to meter shops where the necessary testing equipment and trained personnel are available has resulted in unnecessary time and expense being incurred in the process of putting the meters back into operation. In the prior art, there are available references such as U.S. Pat. No. 4,922,185 to Davidson et al, U.S. Pat. No. 4,271,390 to Canu, U.S. Pat. No. 4,117,530 Reed et al, Farrington, W. H.; "Tests Universal Polyphase Meters"—Electrical World (Jan. 21, 1957), and "The Average Beast: A KWH Meter Tester For Rapid Field Testing of Customers Meters" all of which generally relate to kilowatt hour meters. Among those references, only the reference of Davidson et al shows a diagnostic meter base for testing the connection of a self-contained meter in a polyphase installation. The meter base incorporates a lamp which responds to current through the circuit elements in the base whereby the pattern of lamp responses indicates the pattern connections in the installation.

However, Davidson et al differs from the present invention in that it does not incorporate any structure by which a digital display in the kilowatt hour meter can be energized. As a result, applicant has found that the prior art as a whole has not addressed the problem as discussed above to which the present invention is directed, nor does the prior art have any teaching for a device similar to the present invention.

SUMMARY OF THE INVENTION

A main object of the present invention is to provide a device for energizing the electronic digital display found on current kilowatt hour meters in order to read the digital display of meters that have been removed from their site location.

Another object of the present invention is to provide a device that is simple to operate even by inexperienced personnel having no prior knowledge of kilowatt hour meters.

Accordingly, a further object of the invention is to provide a system for allowing service personnel to read the meter even if they are located in remote areas. In particular, the structure of the device will enable service personnel or the local utility office to read the meter without having to locate an energized meter socket with the correct terminal arrangement and correct voltage, or to take the meter to an off-site meter test shop. The device generally incorporates a 13 terminal kilowatt hour meter socket and a six terminal kilowatt hour meter socket which are connected to a 120 volt power source through a step-up transformer. The device is designed to accommodate both socket-type self-contained kilowatt hour meters and socket-type transformer-rated kilowatt hour meters, as well as single phase or polyphase-type meters.

In a preferred embodiment of the invention, a kilowatt hour meter display energizing device for testing digital displays of different types of kilowatt hour meters incorporates a first multi-terminal socket formed so as to accommodate at least a first type of kilowatt hour meter, a second multi-terminal socket formed so as to accommodate at least a second type of kilowatt hour meter, a first energizing circuit means operatively connected to the first socket for energizing a digital display of the first type of kilowatt hour meter, a second energizing circuit means operatively connected to the second socket for energizing a digital display of the second type of kilowatt hour meter, and voltage supply means connected to the first and second energizing circuits, for supplying a voltage thereto. The first socket includes a first plurality of electrical connection terminals, while the second socket includes a second plurality of electrical connection terminals.

In a second embodiment, the present invention is directed to system for energizing a kilowatt hour meter displays for different types of kilowatt hour meters. The system comprises a first multi-terminal socket formed so as to accommodate a plurality of types of kilowatt hour meters, at least a first energizing circuit means operatively connected to the plurality of electrical connection terminals for energizing a digital display of at least a first type of kilowatt hour meter, an voltage supply means connected to the at least first energizing circuit, for supplying a voltage thereto the first socket including a plurality of electrical connection terminals.

BRIEF DESCRIPTION OF THE DRAWINGS

Preferred embodiments of the invention will now be described, by way of example, with reference to the accompanying drawings, wherein.

DETAILED DESCRIPTION OF THE PREFERRED EMBODIMENTS

Figure 1:
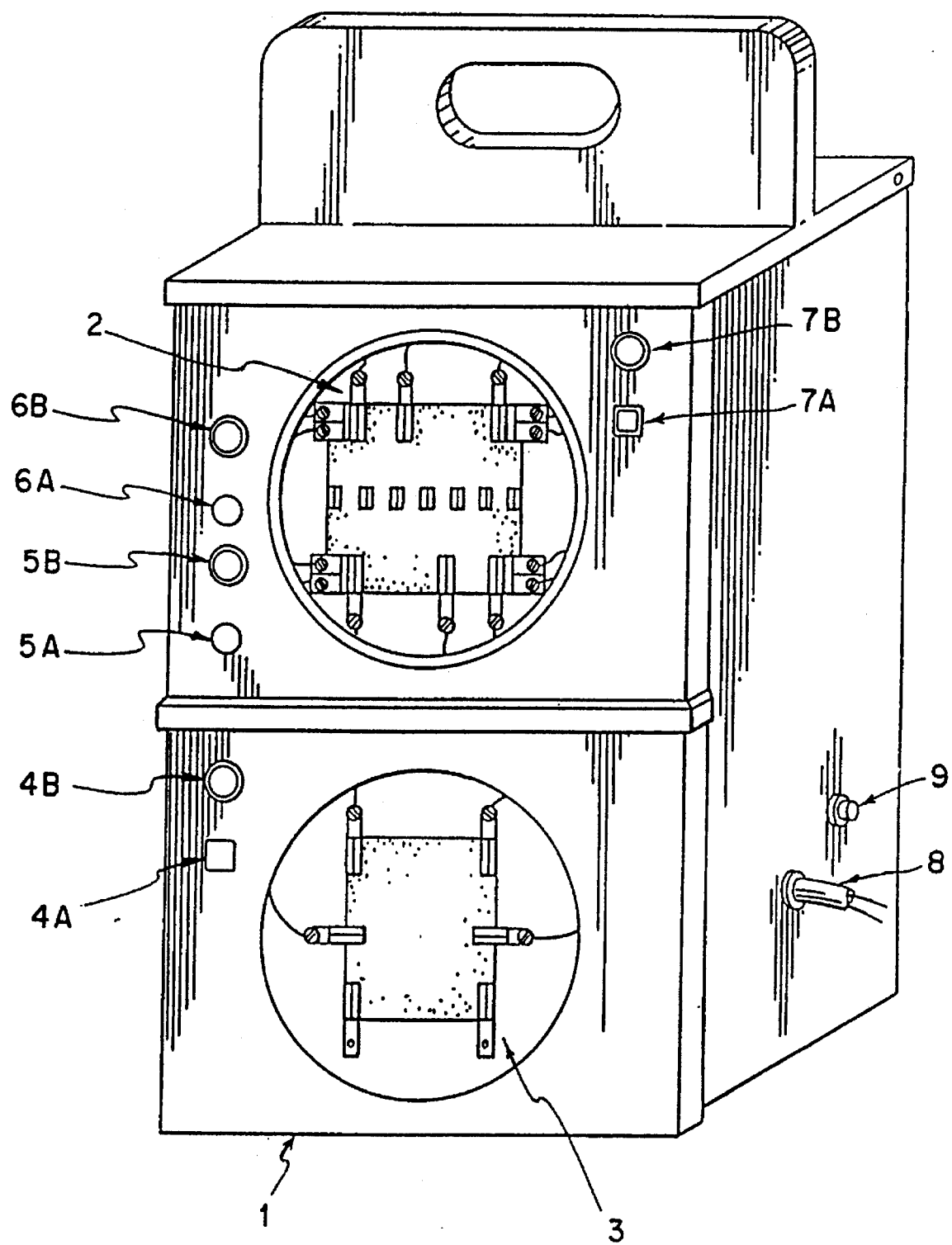
FIG. 1 is a perspective view showing the overall appearance of one embodiment of the invention.

As shown in FIG. 1, the kilowatt hour meter voltage supplying device in which the invention is embodied would be incorporated in a portable case body 1 so as to be transportable to remote, off-site locations. The case body 1 would be formed to accommodate a 13-terminal socket 2, and a 6-terminal socket 3, so as to be able to energize the various types of kilowatt hour meters now in use.

Figure 2:
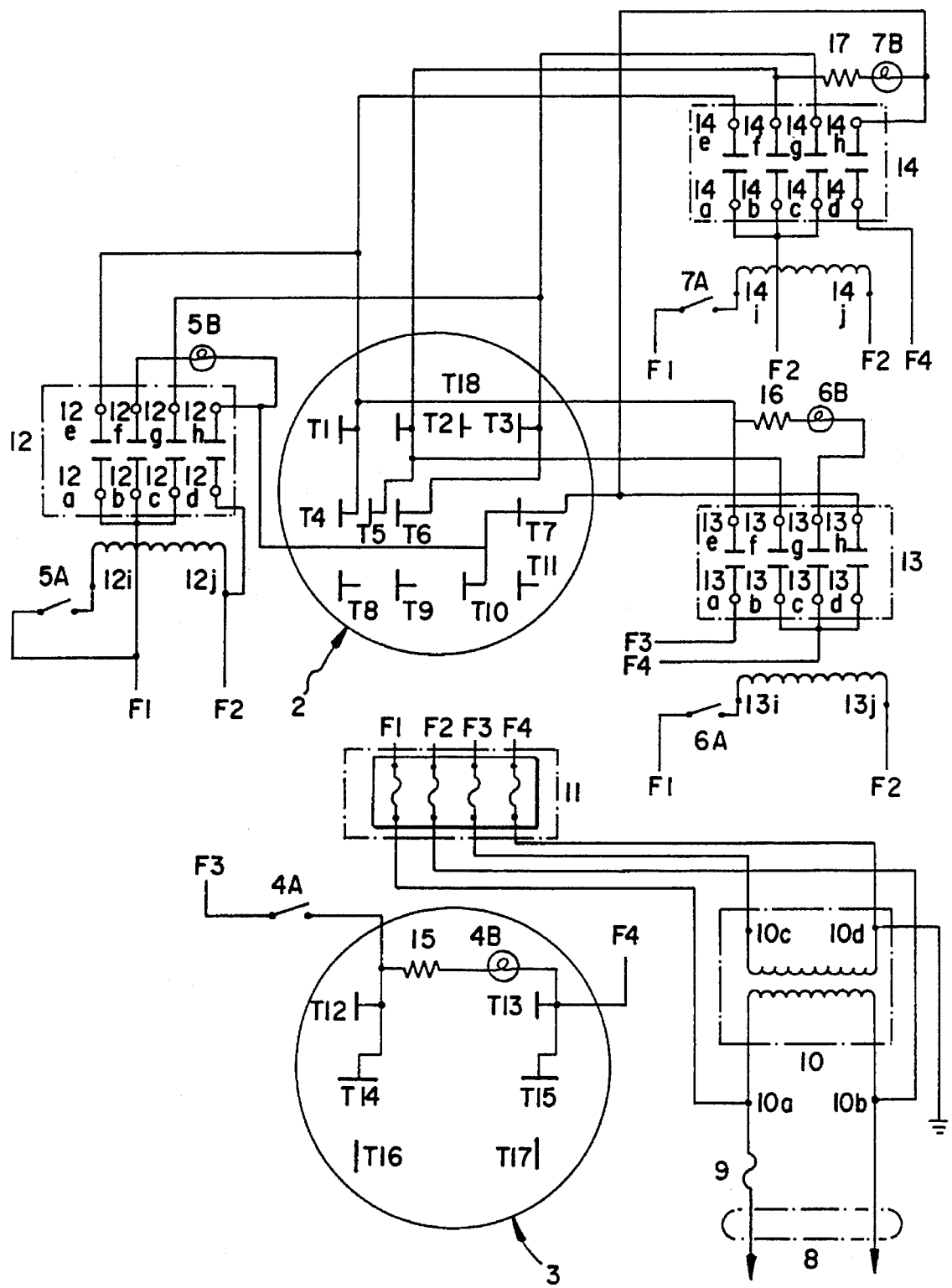
FIG. 2 is a schematic wiring diagram showing the elements of the first preferred embodiment of the invention.

In one preferred embodiment of the invention, the case body 1 is a 13 terminal, 4 wire, transformer rated 17¾"× 11"×4½" meter trough with two meter sockets. The circuit of the invention comprises (as shown in FIG. 2) a 13-terminal, 4-wire, 3-phase, kilowatt hour meter socket 2, and a 6-terminal, 3-wire single phase kilowatt hour socket 3. A 120-volt to 264-volt step-up transformer 10 is used as the primary voltage supply for the circuit. The transformer 10 is connected to an outside 120-volt power source through the power source cord 8 at its primary terminals 10a, 10b. A safety fuse holder 9 holding a 1-amp fuse is connected between the outside 120-volt power source and the primary terminal 10a of the transformer 10 through the power source cord 8. The transformer 10 is then connected on its secondary winding through a four pole fuse block 11 to the remainder of the circuit. Secondary terminal 10d is connected to ground.

Each of the four poles of the fuse block 11 holds a 0.5-amp fuse. Each of the four poles is designated F1, F2, F3 or F4 for purposes of explaining the connections of the fuses in the fuse holder 11 to the circuit. Primary terminals 10a and 10b are connected to fuse poles F1 and F2, respectively. Secondary terminals 10c and 10d from the secondary winding of the transformer 10 are connected to the fuse poles F3 and F4, respectively. Secondary terminal 10d is also connected to ground.

In order to accommodate the various types of kilowatt hour meters currently in use, the sockets 2, 3 are configured so as to be able to energize the different types of meters with the appropriate voltage levels they require. The 13-terminal socket 2 is equipped with three parallel configurations. Each of the three configurations uses a 120-volt, 4-volt type AMF POTTER BRUMFIELD DHU 17A11-120 volt relay (12, 13, 14) in order to separate the circuits of the different voltages and terminal arrangements. In the first configuration, fuse pole F1 is connected to the contact input terminals 12a, 12b and 12c of the relay 12, while fuse pole F2 is connected to the contact input terminal 12d. Fuse poles F1 and F2 are then connected to the armature terminals 12i, 12j, respectively, with a single pole, normal open, momentary push ON switch 5A connected between the fuse pole F1 and the armature terminal 12i. An incandescent, miniature 120 VAC indicator lamp 5B is connected between the contact output terminals 12f and 12h. Contact output terminal 12e is connected to socket terminal T1; output terminal 12f is connected through indicator light 5B to socket terminals T7 and T10. Output terminal 12g is connected to socket terminals T3 and T6; and output terminal 12h is connected to socket terminals T7 and T10. This first configuration supplies 120 volts to the socket.

In the second configuration, fuse pole F3 is connected to the contact input terminal 13a of the relay 13, while fuse pole F4 is connected to the contact input terminals 13b, 13c and 13d. Fuse poles F1 and F2 are then connected to the armature terminals 13i, 13j, respectively, with a single pole, normal open, momentary push ON switch 6A connected between the fuse pole F1 and the armature terminal 13i. Another incandescent, miniature 120 VAC indicator lamp 6B is connected in series with a 10 kΩ, 2 watt resistor 16 between the contact output terminals 13e and 13g. Contact output terminal 13e is connected to socket terminal T1; output terminal 13f is connected to socket terminals T2 and T5. Output terminal 13g is connected through the indicator light 6b and resistor 16 to socket terminals T1; and output terminal 13h is connected to socket terminals T7 and T10. This second configuration supplies 264 volts to the socket.

In the third configuration, fuse pole F3 is connected to the contact input terminal 14a, 14b and 14c of the relay 14, while fuse pole F4 is connected to the contact input terminal 14d. Fuse poles F1 and F2 are then connected to the armature terminals 14i, 14j, respectively, with a single pole, normal open, momentary push ON switch 7A connected between the fuse pole F1 and the armature terminal 14i. Another incandescent, miniature 120 VAC indicator lamp 7B is connected in series with a 10 kΩ, 2 watt resistor 15 between the contact output terminals 14F and 14H. Contact output terminal 14e is connected to socket terminal T1 and T3; output terminal 14f is connected to socket terminals T2 and T5. Output terminal 14h is connected through the indicator light 7b and resistor 16 to socket terminals T7; and output terminal 13h is connected to socket terminals T7 and T10. This third configuration supplies 264 volts to the socket.

The 6-terminal socket 3 is equipped with one configuration for supplying 240 volts. In this configuration, a single pole, normally open, momentary push ON switch 4A is connected at one end to the fuse pole F3, and at the other end to one end of a 10 kΩ, 2 watt resistor 15 and socket terminals T12 and T14. An incandescent, miniature 120 VAC indicator lamp 4B is connected between the other end of the resistor 15 and the socket terminal T13. Fuse pole F4 is connected to socket terminals T13 and T15.

In operation, the power source cord 8 would be connected to a conventional 120 volt wall outlet. A kilowatt hour meter to be tested would then be inserted into the appropriate socket (either 2 or 3). If the 13-terminal socket 2 is used, the appropriate momentary push ON switch (5A, 6A or 7A) is pressed and held in order to supply the necessary voltage based on the voltage rating of the meter being tested. If the 6-terminal socket is selected, momentary push ON switch 4A is pressed. With the digital display activated on the meter, a reading of the meter can thus be made.

Figure 3:
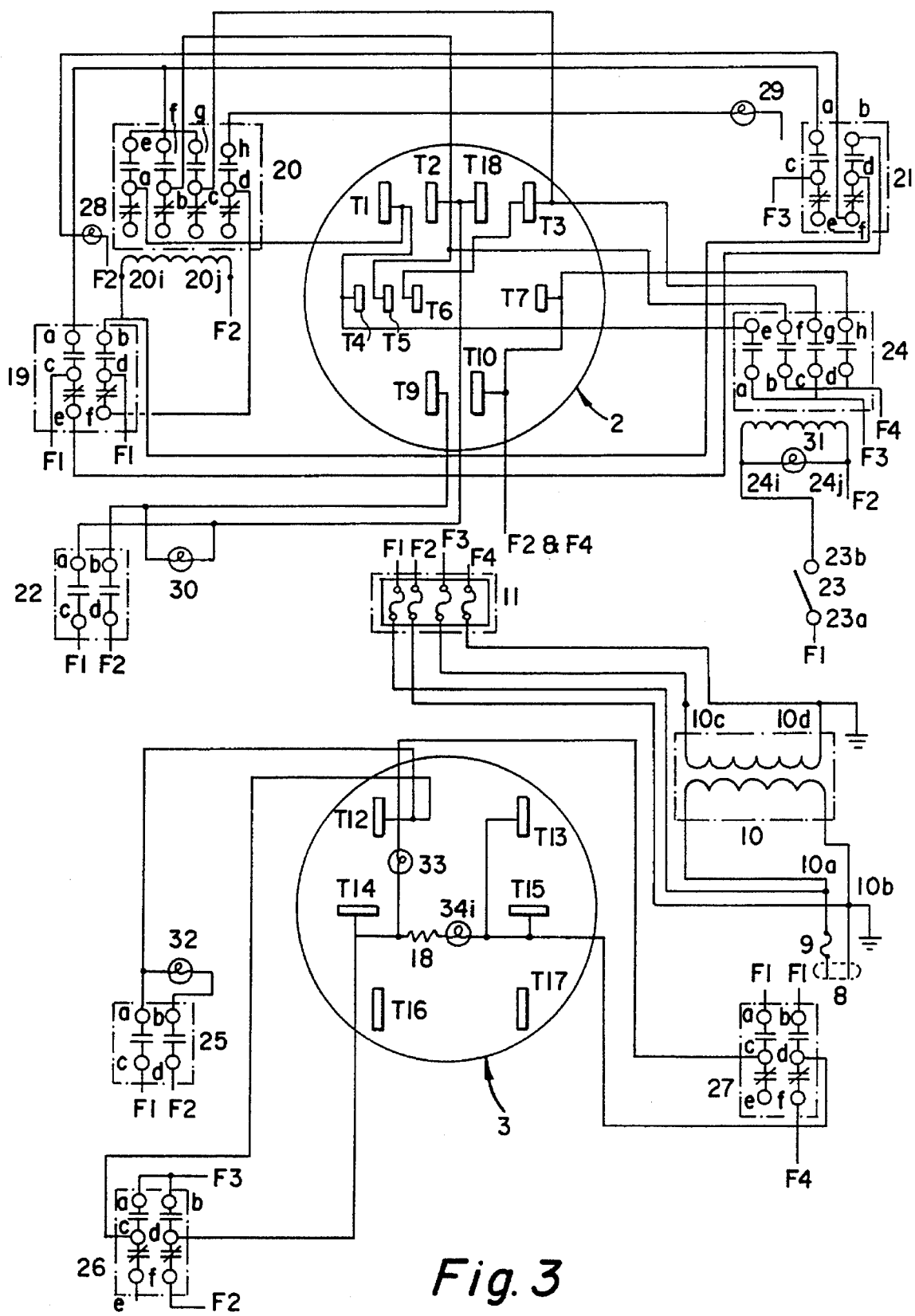
FIG. 3 is a schematic wiring diagram showing the elements of a second preferred embodiment of the invention.

FIG. 3 illustrates a second embodiment of the present invention. As shown and where appropriate, elements common to both the first and second embodiments have been designated with like reference numerals. A full explanation of such elements will thus be omitted from the following description of the second embodiment.

In this second embodiment, the sockets 2, 3 are also configured so as to be able to energize the different types of meters, wherein the 13-terminal socket 2 is equipped with four parallel configurations. In the first configuration, a 4-volt, double throw, 120 volt AC relay 20 is used, along with a double pole, double throw, normally open, momentary push ON switch 19. The fuse pole F1 is connected to the contact input terminals 19c and 19d of the switch 19, while fuse pole F2 is connected to the armature terminal 20j. The armature terminal 20i is connected to the output terminal 19b. The output terminal 19b is also connected to the input terminal 21d of the double pole, double throw, normally open, momentary push ON switch 21. The output terminal 19a is connected to the input terminal 20f of the relay 20. The output terminal 19e is connected to the normally open output terminal 21b of the switch 21. The output terminal 19f is connected to the output terminal 20d of the relay 20. In the relay 20, normally open input terminals 20e, 20f and 20g are connected to each other. The output terminal 20a is connected to the socket terminal T1, while output terminal 20b is connected to socket terminal T5. The output terminal 20c is connected to socket terminal T3. An incandescent, miniature 120 VAC indicator lamp 28 is connected between the fuse pole F2 and the normally closed output terminal 21f of the switch 21. This first configuration supplies 120 volts to the socket 2 for a 120 volt, four wire-type kilowatt hour meter.

In the second configuration, fuse pole F3 is connected to the contact input terminal 21c of the relay 21. The normally open output terminal 21a is connected to the normally open input terminal 20f. Another incandescent, miniature 120 VAC indicator lamp 29 is connected between the fuse pole F2 and the normally open input terminal 20h of the relay 20. This second configuration supplies 264 volts to the socket for a 277 volt, four wire-type meter.

In the third configuration, fuse pole F1 is connected to the contact input terminal 22c of a double pole, single throw, normally open, momentary push ON switch 22. The fuse pole F2 is connected to the input terminal 22d of the switch 22. The output terminal 22a is connected to socket terminals T2 and T18, while output terminal 22b is connected to socket terminal T9. An incandescent, miniature 120 VAC indicator lamp 30 is connected between the output terminals 22a and 22b of the switch 22. This third configuration supplies 120 volts AC to the socket 2 for a three-phase, three wire, 120 volt eight terminal-type meter.

In a fourth configuration, fuse pole F1 is connected to the contact input terminal 23a of a single pole, single throw, normally open, momentary push ON switch 23. The output terminal 23b is connected to the armature terminal 24i of a four pole, double throw, 120 volt AC relay 24. The fuse pole F2 is connected to the armature terminal 24j of the relay 24. The fuse pole F3 is connected to input terminals 24a and 24c, while fuse pole F4 input terminals 24b and 24d. The normally open output terminals 24f and 24g are connected to socket terminals T5 and T3, respectively. The normally open output terminal 24e is connected to socket terminals T1 and T4, while the normally open output terminal 24h is connected to socket terminals T7 and T10. Socket terminal T10 is also connected to fuse poles F2 and F4. Socket terminal T3 is also connected to socket terminal T6. An incandescent, miniature 120 VAC indicator lamp 31 is connected between the armature terminals 24i and 24j. This fourth configuration supplies 264 volts AC to the socket 2 for a 240 volt, four wire-type meter.

The 6-terminal socket 3 in this second embodiment is equipped with three parallel configurations which hereafter will be described as the fifth, sixth and seventh configurations of the device. In the fifth configuration, a double pole, single throw, normally open, momentary push ON switch 25 is used wherein the contact input terminals 25c and 25d are connected to the fuse poles F1 and F2, respectively. The output terminal 25a of the switch 25 is connected to socket terminal T12 in the socket 3. An incandescent, miniature 120 VAC indicator lamp 32 is connected between the output terminal 25a and the output terminal 25b. This fifth configuration supplies 120 volts to the socket 3 for a 120 volt, two wire-type meter.

In a sixth configuration, a double pole, double throw, normally open, momentary push ON switch 26 is connected through its normally closed input terminal 26f to the fuse pole F2, while the normally open input terminals 26a and 26b are connected to the fuse pole F3. The output terminal 26c is connected to the socket terminal T12, while the output terminal 26d is connected to the socket terminal T14. The socket terminal T14 is also connected to one end of a 10 kΩ, 2 watt resistor 18. An incandescent, miniature 120 VAC indicator lamp 34 is connected between the other end of the resistor 18 and socket terminals T13 and T15. This sixth configuration supplies 120 volts to the socket 3 for a 120 volt, three wire-type meter.

In a seventh configuration, a double pole, double throw, normally open, momentary push ON switch 27 is connected through its normally closed input terminal 27f to the fuse pole F4, while the normally open input terminals 27a and 27b are connected to the fuse pole F1. The output terminal 27c is connected to the socket terminal T14 through an incandescent, miniature 120 VAC indicator lamp 33, while the output terminal 27d is connected to the socket terminal T15. This seventh configuration supplies 120 volts AC to the socket 3 for a three phase, three wire, 120 volt AC five terminal-type meter.

In operation, like the first embodiment, the power source cord 8 would be connected to a conventional 120 volt wall outlet. A kilowatt hour meter to be tested would then be inserted into the appropriate socket (either 2 or 3). If the 13-terminal socket 2 is used, the appropriate momentary push ON switch (19, 21, 22 or 23) is pressed and held in order to supply the necessary voltage based on the voltage rating of the meter being tested. If the 6-terminal socket is selected, the appropriate momentary push ON switch (25, 26 or 27) is likewise pressed. With the digital display activated on the meter, a reading of the meter can thus be made.

Although specific embodiments of the present invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

I claim:

1. A kilowatt hour meter display energizing device for energizing digital displays of different types of kilowatt hour meters, the device comprising:

a first female multi-terminal socket means formed so as to accommodate at least a first type of kilowatt hour meter, said first socket means including a first plurality of female electrical sockets;

a second female multi-terminal socket means formed so as to accommodate at least a second type of kilowatt hour meter, said second socket means including a second plurality of female electrical sockets;

a first energizing circuit means operatively connected to said first socket means, for energizing a digital display of the first type of kilowatt hour meter;

a second energizing circuit means operatively connected to said second socket means, for energizing a digital display of the second type of kilowatt hour meter; and a third energizing circuit means operatively connected to said first socket means, for energizing a digital display of third type of kilowatt hour meter;

voltage supply means connected to said first and second energizing circuits, for supplying a voltage thereto.

2. A kilowatt hour meter display energizing device according to claim 1, further comprising:

a fourth energizing circuit means operatively connected to said first socket means, for energizing a digital display of a fourth type of kilowatt hour meter, wherein said first female multi-terminal socket means is further formed so as to accommodate at least said first, third and fourth types of kilowatt hour meters, said first, third and fourth energizing circuits means being connected in parallel to each other relative to said first socket means.

3. A kilowatt hour meter display energizing device according to claim 2, wherein said first energizing circuit means is connected to said voltage supply means so as to supply 120 volts, said third energizing circuit is connected to said voltage supply means so as to supply 264 volts and said fourth energizing circuit is connected to said voltage supply means so as to supply 264 volts.

4. A kilowatt hour meter display energizing device according to claim 2, wherein each of said first, second, third and fourth energizing circuit means includes activating means connected between said voltage supply means and a corresponding energizing circuit, for activating a kilowatt hour meter connected in a corresponding socket.

5. A kilowatt hour meter display energizing device according to claim 2, wherein said fourth energizing circuit means is connected to said voltage supply means so as to supply 264 volts.

6. A kilowatt hour meter display energizing device according to claim 1, wherein said first socket means is a 13-terminal meter socket.

7. A kilowatt hour meter display energizing device according to claim 1, wherein said second socket means is a 6- terminal meter socket.

8. A kilowatt hour meter display energizing device according to claim 1, wherein said second energizing circuit means is connected to said voltage supply means so as to supply 264 volts.

9. A kilowatt hour meter display energizing device according to claim 2, wherein said voltage supply means includes a step-up transformer, and each of said first, third and fourth energizing circuit means includes a multi-pole type relay connected in parallel to each other relative to said first socket means and said voltage supply means.

10. A kilowatt hour meter display energizing device according to claim 1, wherein each of said first, second and third energizing circuit means includes activating means connected between said voltage supply means and a corresponding energizing circuit, for activating a kilowatt hour meter connected in a corresponding socket.

11. A kilowatt hour meter display energizing device according to claim 1, further comprising:
  a fourth energizing circuit means operatively connected to said first socket means, for energizing a digital display of a fourth type of kilowatt hour meter;
  a fifth energizing circuit means operatively connected to said first socket means, for energizing a digital display of a fifth type of kilowatt hour meter;
  a sixth energizing circuit means operatively connected to said second socket means, for energizing a digital display of a sixth type of kilowatt hour meter; and
  a seventh energizing circuit means operatively connected to said second socket means, for energizing a digital display of a seventh type of kilowatt hour meter, wherein
  said first multi-terminal socket means is further formed so as to accommodate at least said first, third, fourth and fifth types of kilowatt hour meters, said first, third and fourth energizing circuit means being connected parallel to each other relative to said first socket means, and
  said second female multi-terminal socket means is further formed so as to accommodate at least said second, sixth and seventh types of kilowatt hour meters, said second, sixth and seventh energizing circuit means being connected parallel to each other relative to said second socket means.

12. A kilowatt hour meter display energizing device according to claim 11, wherein said first energizing circuit means is connected to said voltage supply means so as to supply 120 volts, said third energizing circuit means is connected so as to supply 264 volts, said fourth energizing circuit means is connected so as to supply 120 volts and said fifth energizing circuit means is connected so as to supply 264 volts.

13. A kilowatt hour meter display energizing device according to claim 11, wherein said second energizing circuit means is connected to said voltage supply means so as to supply 120 volts, said sixth energizing circuit means is connected so as to supply 120 volts and said seventh energizing circuit means is connected so as to supply 120 volts.

14. A kilowatt hour meter display energizing device according to claim 11, wherein said voltage supply means includes a step-up transformer, and each of said first and fourth energizing circuit means includes a multi-pole type relay connected in parallel relative to said first socket means and said voltage supply means.

15. A kilowatt hour meter display energizing device according to claim 10, wherein each of said first, second, third, fourth, fifth, sixth and seventh energizing circuit means includes activating means connected between said voltage supply means and a corresponding energizing circuit, for activating a kilowatt hour meter connected in a corresponding socket.

\* \* \* \* \*